United States Patent
Uchiyama

(10) Patent No.: US 8,536,711 B2
(45) Date of Patent: Sep. 17, 2013

(54) CHIP-STACKED SEMICONDUCTOR AND MANUFACTURING METHOD THEREOF

(75) Inventor: Shiro Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/064,758

(22) Filed: Apr. 13, 2011

(65) Prior Publication Data

US 2011/0193242 A1 Aug. 11, 2011

Related U.S. Application Data

(62) Division of application No. 12/078,295, filed on Mar. 28, 2008, now Pat. No. 7,943,470.

(30) Foreign Application Priority Data

Mar. 30, 2007 (JP) .................. 2007-093542

(51) Int. Cl.
*H01L 29/04* (2006.01)
*H01L 23/52* (2006.01)

(52) U.S. Cl.
USPC ............. 257/774; 257/13; 257/377; 257/508; 257/E23.011; 257/E23.114; 257/E23.145

(58) Field of Classification Search
USPC ................ 257/E23.011, E23.114, E23.145, 257/13, 377, 508, 774
See application file for complete search history.

(56) References Cited

U.S. PATENT DOCUMENTS

| 7,943,470 | B2 | 5/2011 | Uchiyama | |
|---|---|---|---|---|
| 2003/0003682 | A1* | 1/2003 | Moll et al. | 438/435 |
| 2006/0001174 | A1* | 1/2006 | Matsui | 257/774 |
| 2007/0069364 | A1 | 3/2007 | Kawano et al. | |
| 2007/0210408 | A1* | 9/2007 | Watanabe et al. | 257/510 |
| 2008/0136990 | A1* | 6/2008 | Kimura | 349/46 |

FOREIGN PATENT DOCUMENTS

JP 2006-261403 9/2006

OTHER PUBLICATIONS

United States Office Action dated Jun. 7, 2012 in U.S. Appl. No. 13/064,757.
United States Office Action dated Dec. 18, 2012 in U.S. Appl. No. 13/064,757.

* cited by examiner

*Primary Examiner* — Long K Tran
(74) *Attorney, Agent, or Firm* — McGinn IP Law Group, PLLC

(57) ABSTRACT

A semiconductor device includes a through electrode that penetrates through a silicon substrate, an isolation trench provided to penetrate through the silicon substrate to surround the through electrode, a first silicon film in contact with an inner surface of the isolation trench, a second silicon film in contact with an outer surface of the isolation trench, and an insulation film provided between the first and second silicon films.

20 Claims, 13 Drawing Sheets

CHIP-STACKED SEMICONDUCTOR AND MANUFACTURING METHOD THEREOF

RELATED APPLICATIONS

The present Application is a divisional Application of U.S. patent application Ser. No. 12/078,295 which was filed on Mar. 28, 2008 now U.S. Pat. No. 7,943,470, and which claims priority from JPA No. 2007-093542, incorporated herein by reference.

TECHNICAL FIELD

The present invention relates to a semiconductor device and a manufacturing method thereof, and, more particularly relates to a chip-stacked semiconductor device and a manufacturing method thereof.

BACKGROUND OF THE INVENTION

In recent years, a chip-stacked semiconductor device having a plurality of semiconductor chips stacked is proposed. In the chip-stacked semiconductor device, through electrodes that penetrate through a silicon substrate are formed on each semiconductor chip stacked. The semiconductor chips are electrically connected to each other via the through electrodes.

FIGS. 25A and 25B are explanatory views showing a conventional chip-stacked semiconductor device, where FIG. 25A is a schematic cross-sectional view of one through electrode out of plural through electrodes provided on each semiconductor chip, and FIG. 25B shows a cross-sectional view along B-B line of FIG. 25A.

As shown in FIG. 25A, a silicon substrate 10 is formed with a ring-shaped isolation trench 11 that penetrates through the silicon substrate 10. Within the isolation trench 11, there are formed a silicon thermal oxide film 12 that covers a side surface of the isolation trench 11, and a polycrystalline silicon film 13 that fills in a portion not filled in by the silicon thermal oxide film 12.

A connection electrode 14 is formed on the silicon substrate 10, and a wiring layer 15 is formed on the connection electrode 14. An opening 17 is formed on the rear surface of the silicon substrate 10 to penetrate through an insulation film 16 formed on the rear surface of the silicon substrate 10 and through the silicon substrate 10. A through electrode 18 is formed within the opening 17. Based on a connection between the through electrode 18 and the connection electrode 14, the through electrode 18 is electrically connected to the wiring layer 15.

The isolation trench 11 is seamlessly formed to surround the through electrode, as shown in FIG. 25B. Accordingly, the silicon substrate 10 at the outside of the isolation trench 11 is electrically insulated from the through electrode 18.

As explained above, to form an electrode on the rear surface of the silicon substrate 10 that is connected to the connection electrode 14 formed on the main surface of the silicon substrate 10, the thermal oxide film 12 and the polycrystalline silicon film 13 buried in the isolation trench 11 for insulating the through electrode 18 from the silicon substrate 10 is necessary around the through electrode 18. However, a forming method of the isolation trench by the conventional technique has the following problems.

To form the thermal oxide film 12 and the polycrystalline silicon film 13, first, the silicon substrate 10 is etched from the main surface thereof so as to form the isolation trench 11. By thermally oxidizing the inner surface of the isolation trench 11, the silicon thermal oxide film 12 that covers the inner surface of the isolation trench 11 is formed. Thereafter, the polycrystalline silicon film 13 is embedded into the gap of the isolation trench 11 not completely filled in by the silicon thermal oxide film 12.

Because the whole isolation trench 11 becomes a dead space, the width of the isolation trench 11 is preferably as small as possible to make it possible isolate the silicon substrate 10 from the through electrode 18.

However, the current silicon etching technique takes a very long time to etch such a narrow (thin) trench, and has a cost problem. Therefore, the isolation trench 11 is formed to have a certain width.

Therefore, as described above, even when the silicon thermal oxide film 12 is attempted to have as large thickness as possible by thermally oxidizing the inner surface of the isolation trench 11, it is difficult to fully fill in the isolation trench 11 with only the silicon thermal oxide film 12. Consequently, as described above, the polycrystalline silicon film 13 is embedded into the gap of the isolation trench 11 not completely filled in by the silicon thermal oxide film 12, by the CVD (Chemical Vapor Deposition) method.

The reason why the polycrystalline silicon film 13 is used as a material embedded into the gap within the isolation trench 11 is described below. When a CVD silicon oxide film is embedded instead of the polycrystalline silicon film 13, a film thickness combined with the thickness of the silicon thermal oxide film 12 becomes so large that strong tension is applied to the silicon substrate 10. Moreover, when a CVD silicon oxide film is embedded instead of the polycrystalline silicon film 13, a total film thickness of the silicon oxide films (the silicon thermal oxide film 12 and the CVD silicon oxide film) formed on the silicon substrate 10 becomes very large. Therefore, it becomes very difficult to flatten the total silicon oxide films. Accordingly, other materials such as a polycrystalline silicon film need to be used, and this complicates the process. Note that, for example, Japanese Patent Application Laid-open No. 2006-261403 discloses a semiconductor device having a through electrode.

SUMMARY OF THE INVENTION

The present invention has been achieved to solve the above problems, and it is an object of the present invention to provide a chip-stacked semiconductor device and a manufacturing method thereof capable of preventing the increase of a chip area and securing a sufficient size of a through electrode-forming area without decreasing an etching rate in a silicon substrate etching to form an isolation trench.

The semiconductor device according to the present invention includes: a through electrode that penetrates through a silicon substrate; an isolation trench provided to penetrate through the silicon substrate to surround the through electrode; a first silicon film in contact with an inner surface of the isolation trench; a second silicon film in contact with an outer surface of the isolation trench; and an insulation film provided between the first silicon film and the second silicon film.

The manufacturing method of the semiconductor device according to the present invention includes: a first step of forming an isolation trench to surround a through electrode-forming area from a front surface of a silicon substrate; a second step of directly forming a silicon film on a bottom surface and a side surface of the isolation trench; a third step of forming an insulation film on the silicon film to fill in a gap remaining in the isolation trench after forming the silicon film; a fourth step of grinding a rear surface of the silicon substrate to expose the isolation trench to the rear surface side of the silicon substrate; and a fifth step of forming a through electrode that penetrates through the silicon substrate, in the through electrode-forming area.

According to the present invention, the silicon film within the isolation trench can be substantially regarded as a part of the silicon substrate. Therefore, even when the width of the isolation trench is increased to increase the etching rate, the width of the insulation film becoming a dead space can be made sufficiently small. Consequently, the chip area can be decreased.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained below in detail with reference to the accompanying drawings.

FIG. 1 to FIG. 13 are process views schematically showing a manufacturing process of a semiconductor device according to a first embodiment of the present invention. FIG. 1 to FIG. 13 show cross-sectional views of an area where one of plural through electrodes to be formed on a silicon substrate is formed and show a peripheral part thereof.

Figure 1:
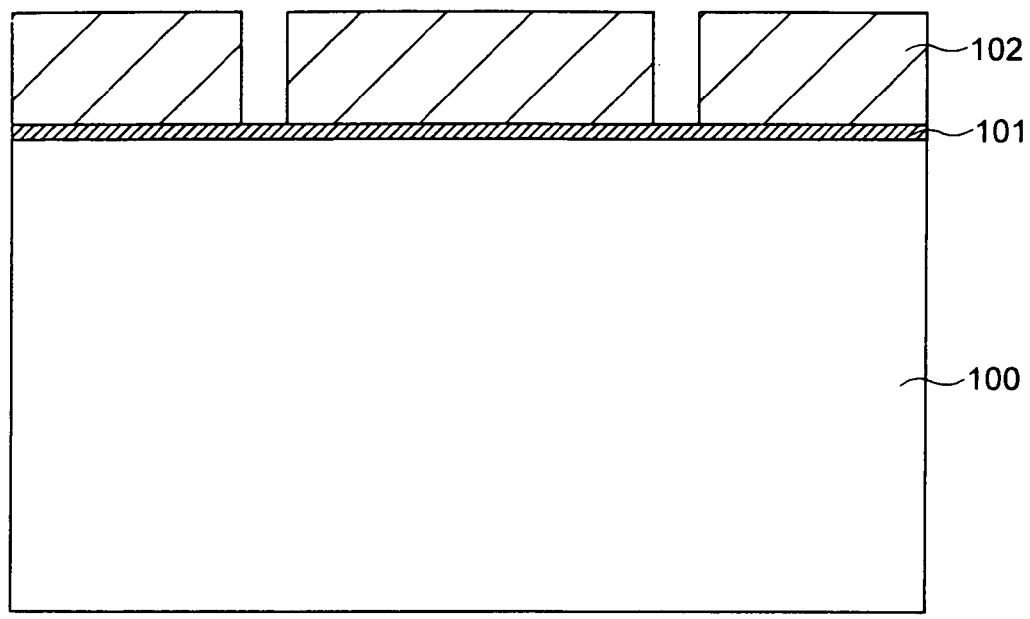
FIG. 1 is a partially cross-sectional view showing one process (forming of a silicon nitride film and a mask layer) of a semiconductor device manufacturing method according to a first embodiment of the present invention.

As shown in FIG. 1, first, the silicon nitride film 101 is formed on a silicon substrate 100, as an oxidation protection film in a later thermal oxide process. Next, the mask layer 102 made of photoresist is formed on the silicon nitride film 101. The mask layer 102 includes an opening to form a ring-shaped isolation trench.

Figure 2:
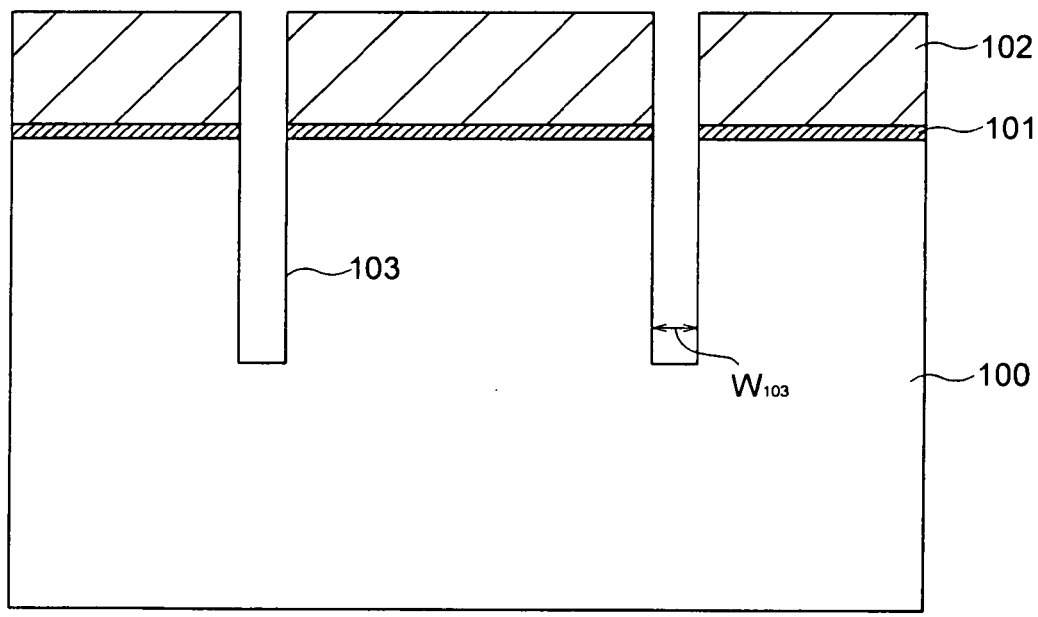
FIG. 2 is a partially cross-sectional view showing one process (forming of a ring-shaped isolation trench 103) of a semiconductor device manufacturing method according to the first embodiment of the present invention.

Next, as shown in FIG. 2, the silicon nitride film 101 and the silicon substrate 100 are etched, using the mask layer 102. As a result, a ring-shaped isolation trench 103 having a width $W_{103}$ of about 5,000 nm is formed.

Figure 3:
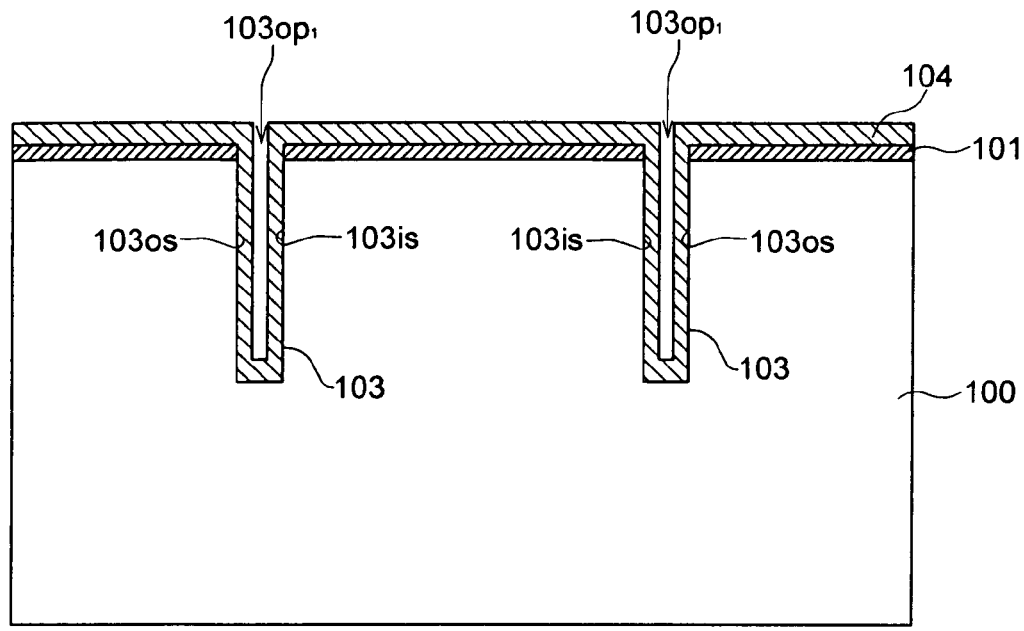
FIG. 3 is a partially cross-sectional view showing one process (forming of a polycrystalline silicon film 104) of a semiconductor device manufacturing method according to the first embodiment of the present invention.

Next, as shown in FIG. 3, a polycrystalline silicon film 104 is formed in a thickness of about 2,000 nm on the whole surface including the inside of the isolation trench 103, by the CVD method. As a result, the polycrystalline silicon film 104 of the thickness about 2,000 nm is formed on the inner surface 103is and an outer surface 103os, respectively within the isolation trench 103. Therefore, a gap $103op_1$ of a width about 1,000 nm remains within the isolation trench 103.

Figure 4:
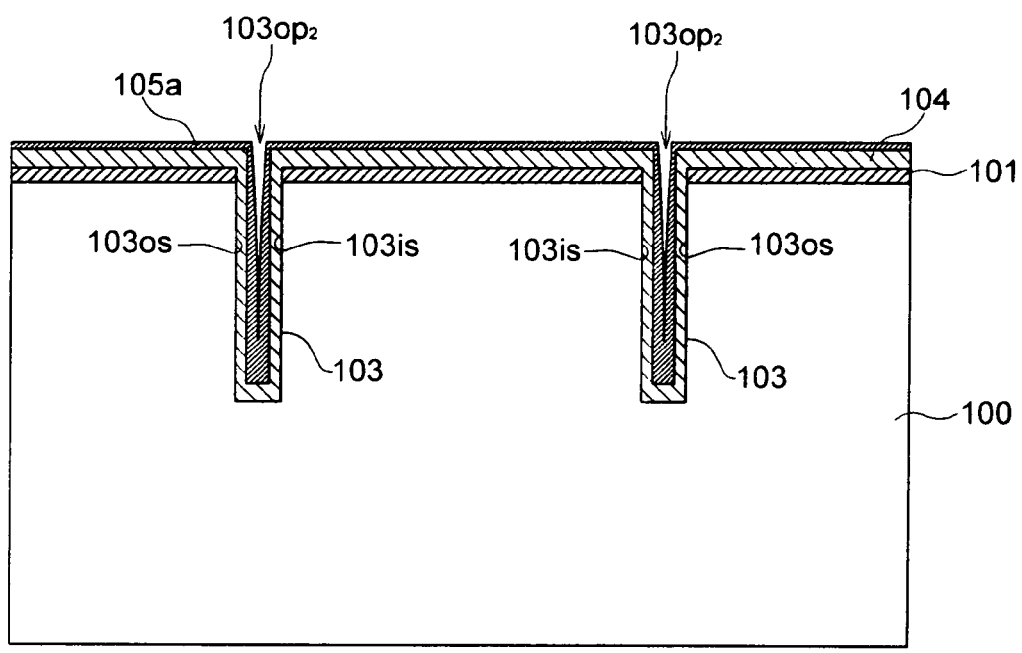
FIG. 4 is a partially cross-sectional view showing one process (forming of a silicon thermal oxide film 105a) of a semiconductor device manufacturing method according to the first embodiment of the present invention.

Next, as shown in FIG. 4, the surface of the polycrystalline silicon film 104 is thermally oxidized. As a result, a silicon thermal oxide film 105a of a thickness about 800 nm is formed. In the thermal oxidization, the surface of the polycrystalline silicon film 104 is oxidized, and is cubically expanded. Therefore, the silicon thermal oxide film 105a becomes in the state as shown in FIG. 4. More specifically, as shown in FIG. 4, a gap $103op_2$ that is not completely filled in by the polycrystalline silicon film 104 and the silicon thermal oxide film 105a remains in the isolation trench 103. In this case, because the silicon nitride film 101 is formed on the surface of the silicon substrate 100, the surface of the silicon substrate 100 can be prevented from being oxidized.

Figure 5:
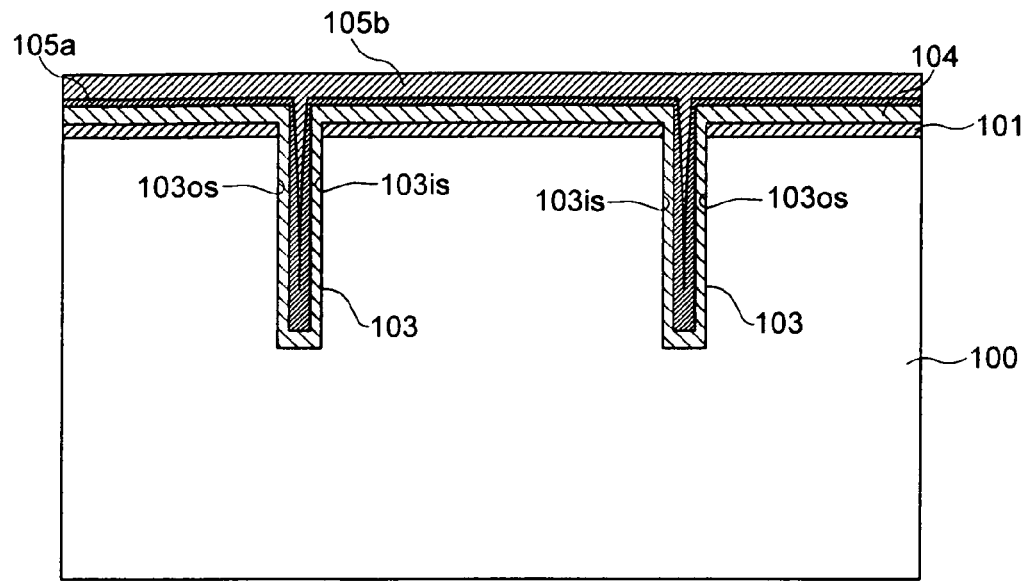
FIG. 5 is a partially cross-sectional view showing one process (forming of a CVD silicon oxide film 105b) of a semiconductor device manufacturing method according to the first embodiment of the present invention.

Next, as shown in FIG. 5, a CVD silicon oxide film 105b is formed on the whole surface to fill in the gap $103op_2$, by the CVD method.

Figure 6:
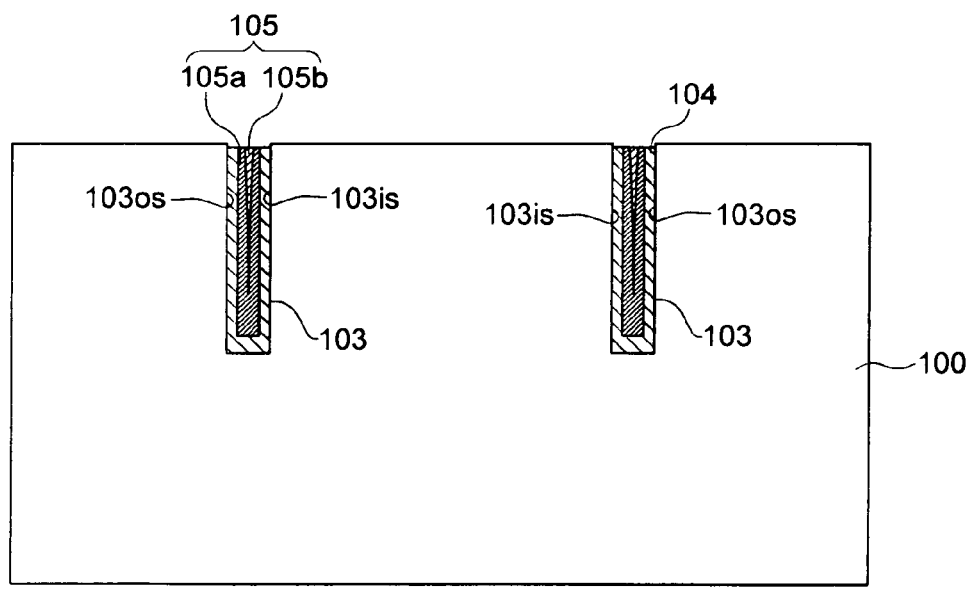
FIG. 6 is a partially cross-sectional view showing one process (removal of the CVD silicon oxide film 105b, the silicon thermal oxide film 105a, the polycrystalline silicon film 104, and the silicon nitride film 101) of a semiconductor device manufacturing method according to the first embodiment of the present invention.

Thereafter, the CVD silicon oxide film 105b, the silicon thermal oxide film 105a, the polycrystalline silicon film 104, and the silicon nitride film 101 on the surface of the silicon substrate 100 are removed to flatten the surface. As a result, as shown in FIG. 6, a structure that the polycrystalline silicon film 104, the silicon thermal oxide film 105a, and the CVD silicon oxide film 105b are embedded into the isolation trench 103 can be obtained. Consequently, a ring-shaped isolation wall 105 including the silicon thermal oxide film 105a and the CVD silicon oxide film 105b is formed.

Figure 7:
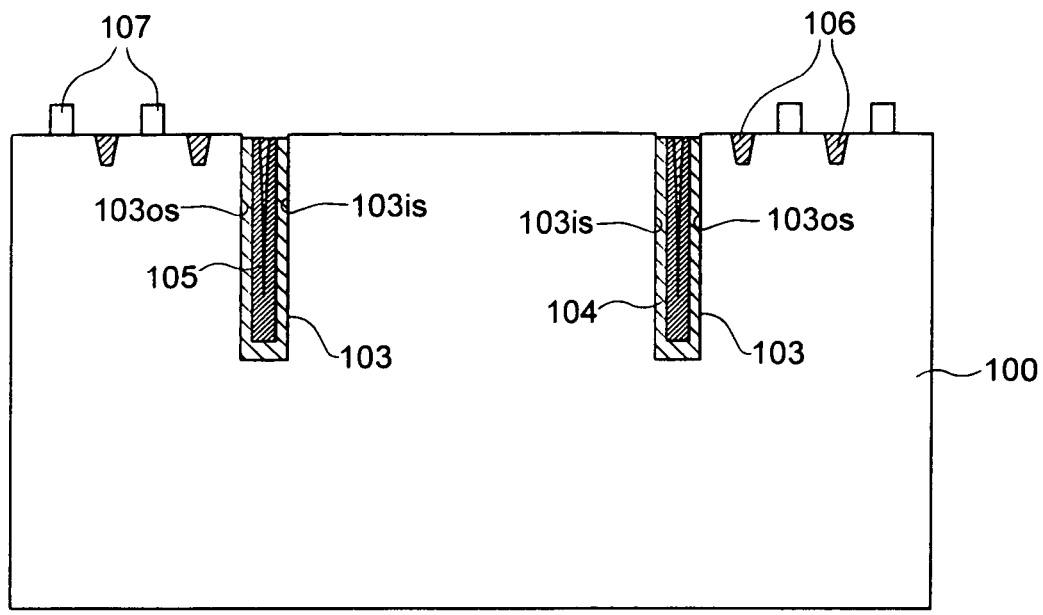
FIG. 7 is a partially cross-sectional view showing one process (forming of an STI 106 and a gate electrode 107) of a semiconductor device manufacturing method according to the first embodiment of the present invention.

In this way, after the process shown in FIG. 6 is finished, an ordinary process to form device elements such as transistors is performed. As shown in FIG. 7, an STI (Shallow Trench Isolation) 106 that is used to an element isolation area is formed, a gate electrode 107 is formed, and a diffusion layer (not shown) is formed.

Figure 8:
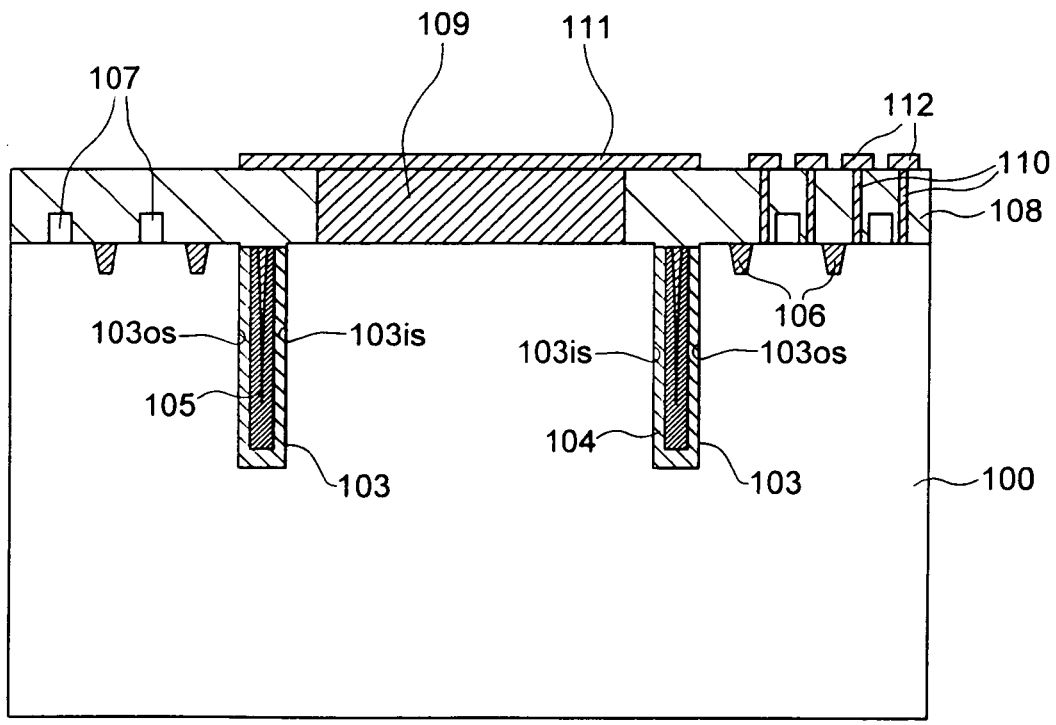
FIG. 8 is a partially cross-sectional view showing one process (forming of an interlayer insulation film 108, a connection electrode 109, a contact plug 110 wirings 111 and 112) of a semiconductor device manufacturing method according to the first embodiment of the present invention.

Further, as shown in FIG. 8, an interlayer insulation film 108 is formed. A connection electrode 109 connected to a through electrode formed later, and a contact plug 110 connected to the diffusion layer are formed in the interlayer insulation film 108. Next, a wiring layer including a wiring 111 to be connected to the connection electrode 109 and wirings 112 to be connected to the contact plugs 110 are formed.

Figure 9:
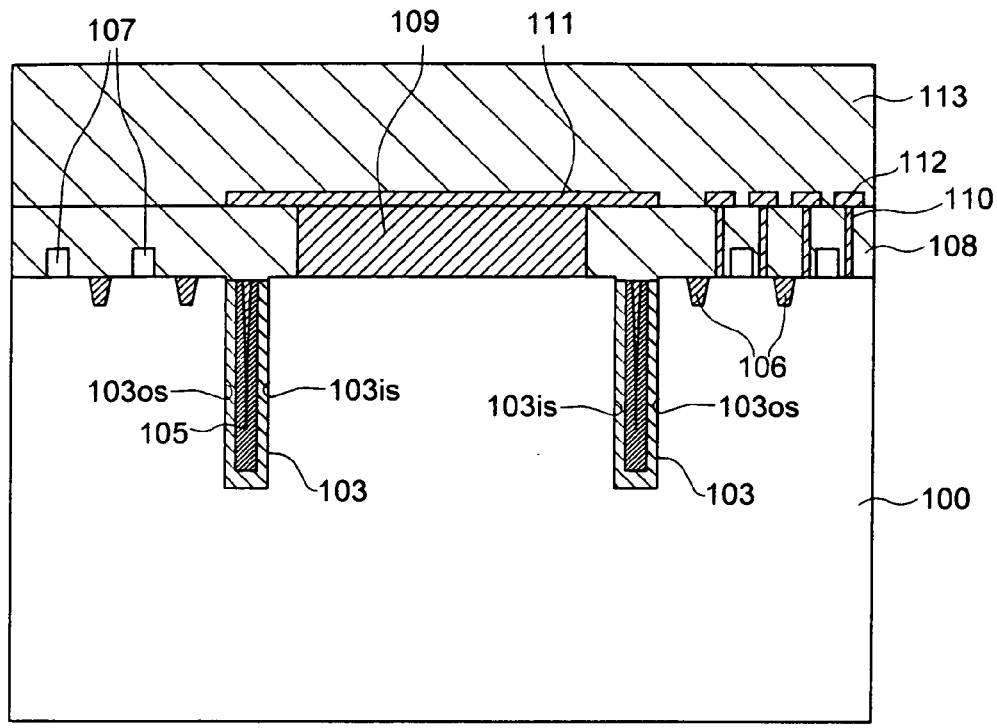
FIG. 9 is a partially cross-sectional view showing one process (forming of an interlayer insulation film 113) of a semiconductor device manufacturing method according to the first embodiment of the present invention.

Next, as shown in FIG. 9, an interlayer insulation film 113 is formed, thereby the manufacturing process on the main surface side is completed.

Thereafter, as explained below, the process shifts to the rear surface side of the silicon substrate 100.

Figure 10:
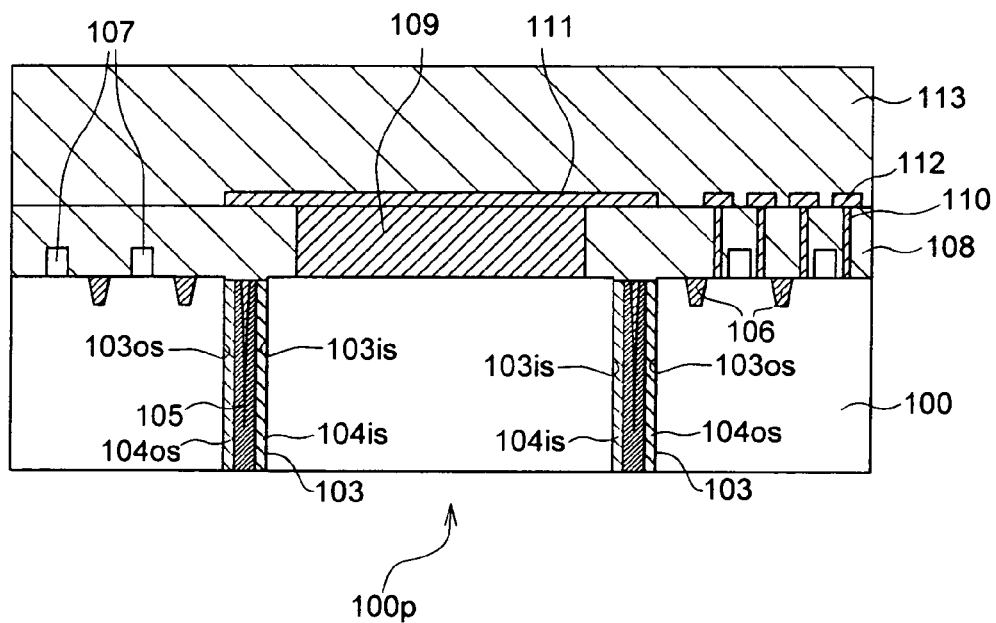
FIG. 10 is a partially cross-sectional view showing one process (grinding of the rear surface of the silicon substrate 100) of a semiconductor device manufacturing method according to the first embodiment of the present invention.

First, the rear surface of the silicon substrate 100 is ground. The rear surface is ground until when the polycrystalline silicon film 104 at the bottom of the isolation trench 103 is removed and the isolation wall (silicon oxide film) 105 is exposed. As a result, as shown in FIG. 10, the polycrystalline silicon film 104 is divided within the isolation trench 103, and a polycrystalline silicon film 104 is remains on an inner surface 103 is of the isolation trench 103, and a polycrystalline silicon film 104os remains on an outer surface 103os of the isolation trench 103.

In this way, a through electrode forming area 100p surrounded by the ring-shaped isolation wall 105 is formed.

Figure 11:
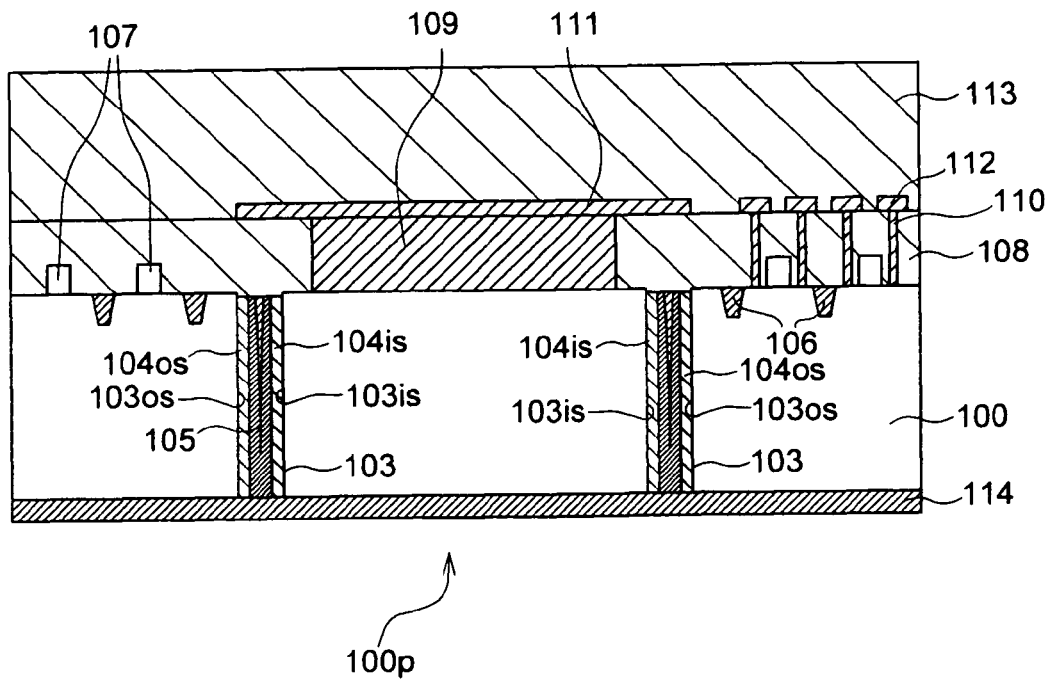
FIG. 11 is a partially cross-sectional view showing one process (forming of a rear-surface insulation film 114) of a semiconductor device manufacturing method according to the first embodiment of the present invention.

Next, as shown in FIG. 11, a rear-surface insulation film 114 that covers the rear surface of the silicon substrate 100 (including the through electrode forming area 100p) is formed.

Figure 12:
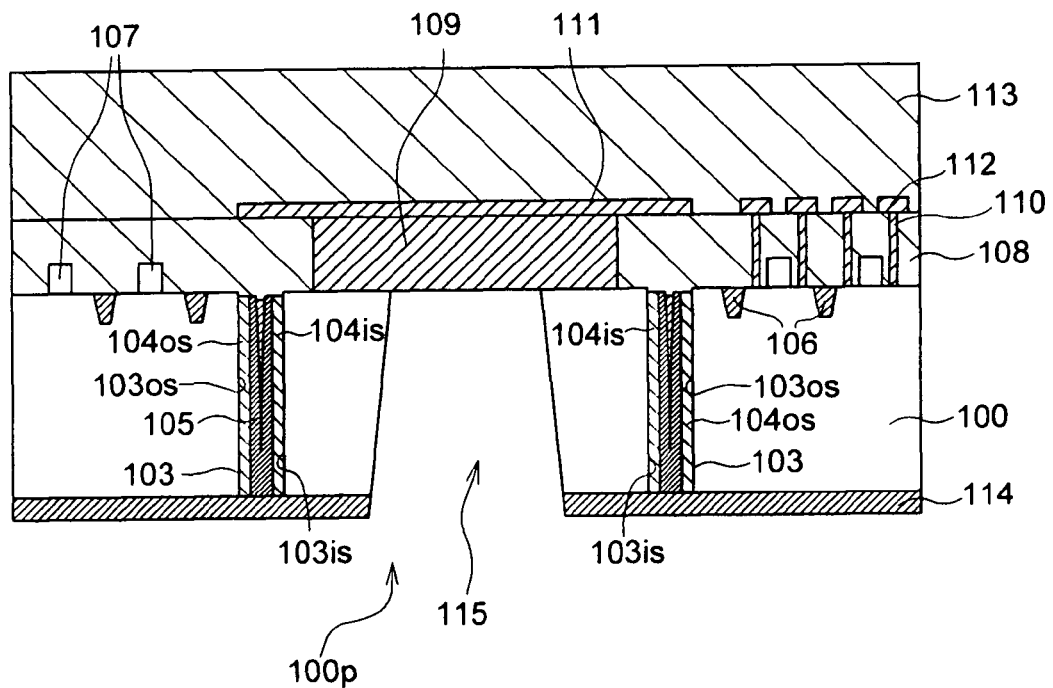
FIG. 12 is a partially cross-sectional view showing one process (forming of an opening 115) of a semiconductor device manufacturing method according to the first embodiment of the present invention.

Next, as shown in FIG. 12, an opening 115 is formed on the through electrode forming area 100p by penetrating through the rear-surface insulation film 114 and the silicon substrate 100 so as to expose the lower surface of the connection electrode 109.

Figure 13:
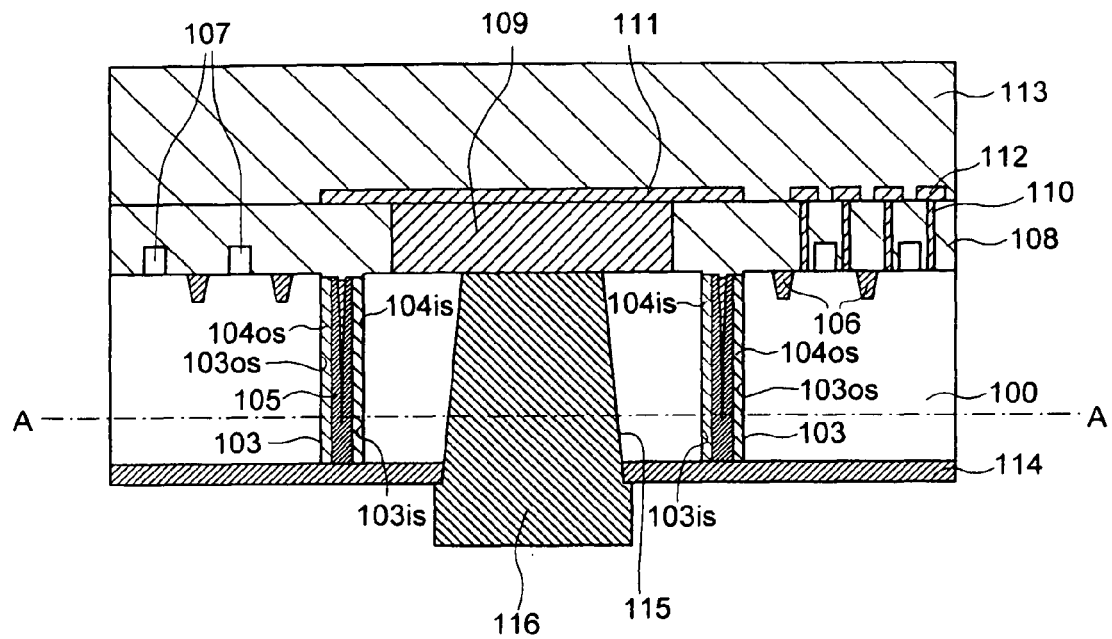
FIG. 13 is a partially cross-sectional view showing one process (forming of a through electrode 116) of a semiconductor device manufacturing method according to the first embodiment of the present invention.

Next, as shown in FIG. 13, an electrode material is formed on the whole rear surface to fill in the opening 115. The electrode material is patterned to form a through electrode 116. In this way, the through electrode 116 surrounded by the isolation wall 105 is completed.

Figure 14:
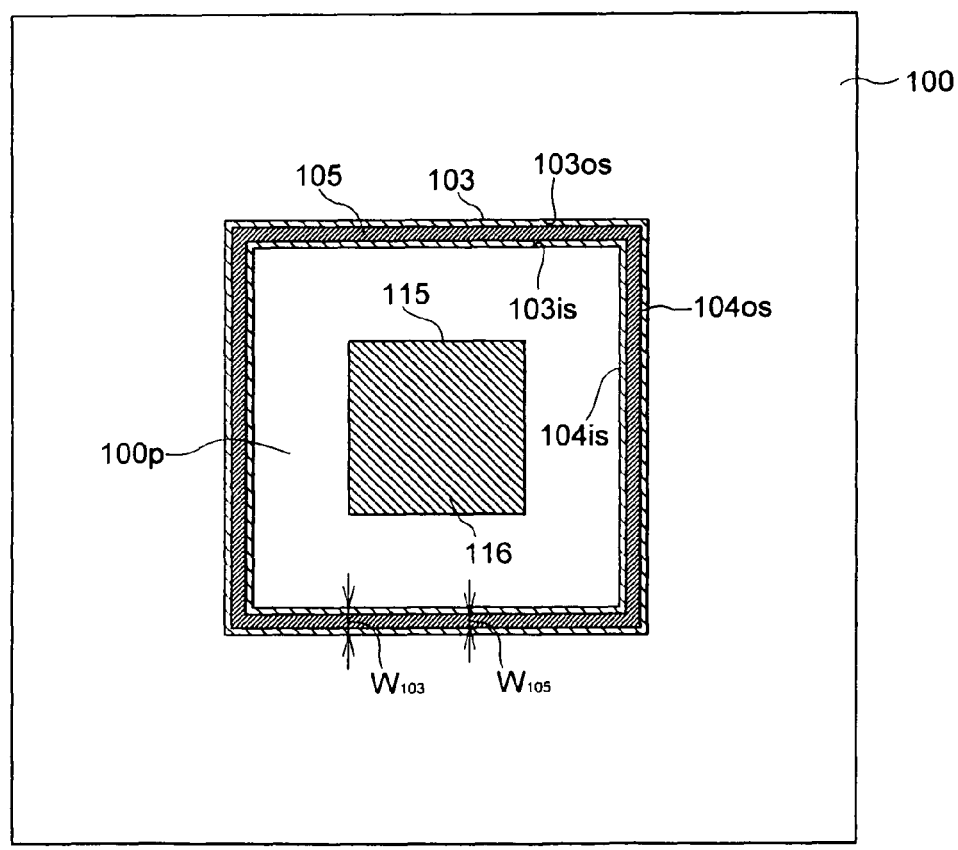
FIG. 14 is a cross-sectional view corresponding to a cross section along A-A line shown in FIG. 13.

FIG. 14 shows a cross-sectional view corresponding to a cross section along A-A line shown in FIG. 13. As shown in FIG. 14, the through electrode 116 is isolated from the surrounding silicon substrate 100 by the ring-shaped isolation wall 105 including an insulation film (silicon oxide film).

As explained above, according to the first embodiment, the polycrystalline silicon film 104 is directly provided on the inner surface 103 is of the isolation trench 103, and the polycrystalline silicon film 104os is directly provided on the outer surface 103os of the isolation trench 103. Therefore, the polycrystalline silicon films 104is and 104os can be regarded as a part of the silicon substrate 100. That is, the total area formed with the isolation trench of the width $W_{103}$ does not become a dead space, but only the area formed with the isolation wall 105 of the width $W_{105}$ becomes the dead space. Consequently, utilization efficiency of the chip surface can be increased.

Accordingly, in forming the opening 115 to form the through electrode 116, it is sufficient to secure margin on the inner surface of the isolation wall 105. Consequently, there arises margin for alignment, by the portion of the polycrystalline silicon film 104is. In forming the STI 106 and the gate electrode 107 on the silicon substrate 100 (see FIG. 7), it is sufficient to secure margin on the outer surface of the isolation wall 105. Consequently, there arises margin for alignment, by the portion of the polycrystalline silicon film 104os. As a result, the chip area can be decreased.

Further, in the first embodiment, because the polycrystalline silicon film 104 is thermally oxidized, the inside of the isolation trench 103 can be securely insulated, even when the aspect ratio of the isolation trench 103 is large.

As described above, according to the first embodiment, even when the width of the isolation trench 103 is increased to increase the etching rate, the width of the insulation film (isolation wall 105) becoming the dead space can be decreased sufficiently. As a result, the chip area can be decreased.

A modification of the first embodiment is explained with reference to FIG. 15 and FIG. 16.

Figure 15:
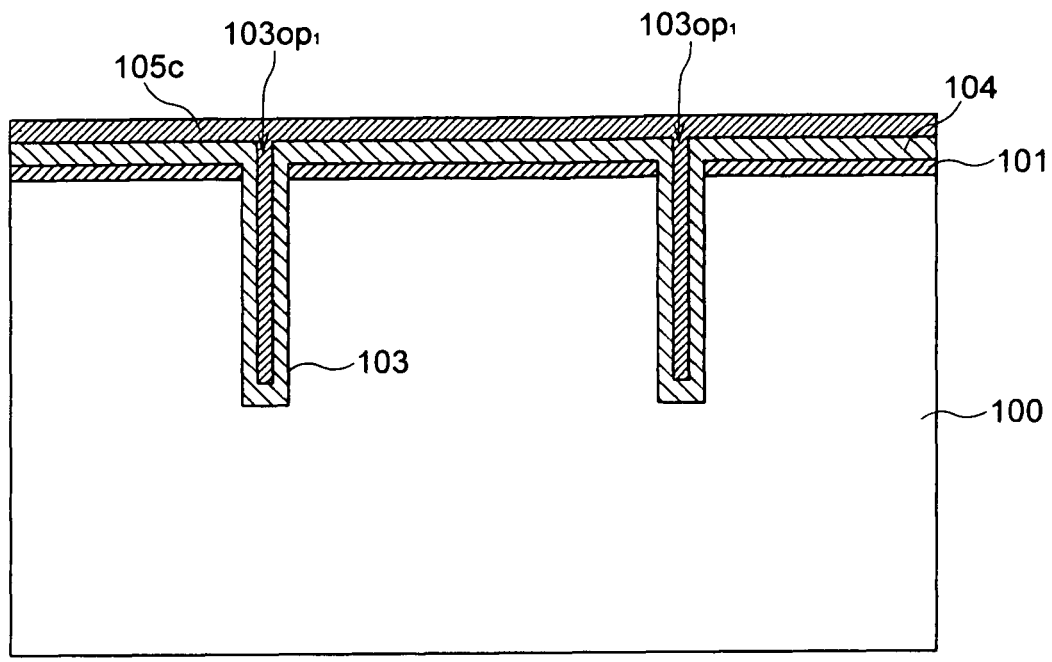
FIG. 15 is a partially cross-sectional view showing one process (forming of a CVD silicon oxide film 105c) of a semiconductor device manufacturing method according to a modification of the first embodiment of the present invention.
Figure 16:
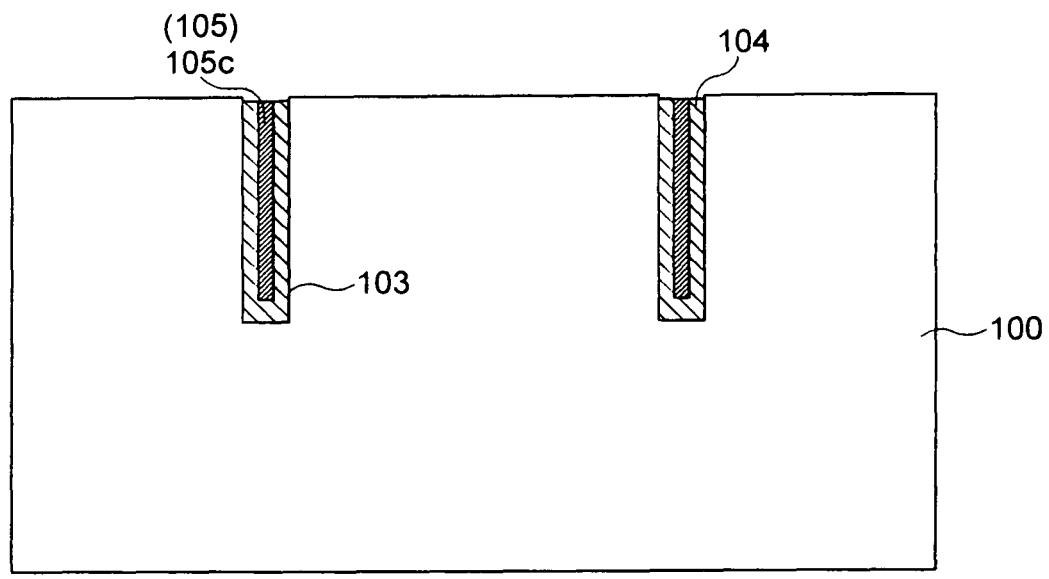
FIG. 16 is a partially cross-sectional view showing one process (removal of the CVD silicon oxide film 105c, the polycrystalline silicon film 104, and the silicon nitride film 101) of a semiconductor device manufacturing method according to the modification of the first embodiment of the present invention.

FIG. 15 and FIG. 16 show a process that can be replaced with the process described with reference to FIG. 4 to FIG. 6. Specifically, after the polycrystalline silicon film 104 is formed as shown in FIG. 3, a CVD silicon oxide film 105c is formed on the whole surface to fill in the gap 103op$_1$ as shown in FIG. 15.

Thereafter, as shown in FIG. 16, the CVD silicon oxide film 105c, the polycrystalline silicon film 104, and the silicon nitride film 101 on the surface of the silicon substrate 100 are removed to flatten the surface. As a result, a structure that the polycrystalline silicon film 104 and the CVD silicon oxide film 105c are embedded into the isolation trench 103 is obtained. Thereafter, the through electrode 116 is completed in the process similar to that shown in FIG. 7 to FIG. 13.

In the present modification, the polycrystalline silicon film 104 is not thermally oxidized. Therefore, a film thickness of the polycrystalline silicon film 104 does not become small, and the CVD silicon oxide film 105c embedded into the gap 103op$_1$ directly becomes the isolation wall 105. Consequently, the width of the isolation wall 105 can be made small. That is, because the occupied area of the isolation wall 105 can be made small, the chip area can be made smaller.

Further, because the insulation film (silicon oxide film) embedded into the isolation trench 103 can be formed in one process, the manufacturing process can be simplified.

As another modification (not shown), in the thermal oxide process shown in FIG. 4, when the cubic expansion of the silicon thermal oxide film 105a is large and also when the opposite silicon thermal oxide films 105a are brought into contact with each other at the upper part of the isolation trench 103, the forming process of the CVD silicon oxide film 105b shown in FIG. 5 can be omitted.

Next, a second embodiment of the present invention is explained with reference to FIG. 17 to FIG. 23. The second embodiment is an example in which the present invention is applied to a silicon interposer. The silicon interposer is a circuit substrate for performing a conversion of an electrode pitch, by being laid out between a package substrate and a stacked chip on a chip-stacked semiconductor device.

Figure 17:
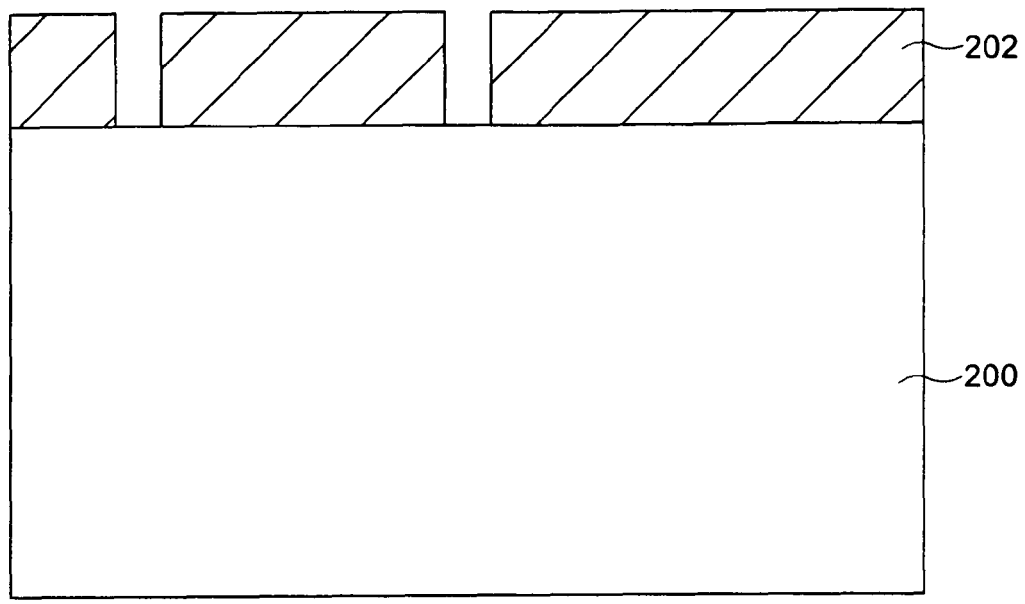
FIG. 17 is a partially cross-sectional view showing one process (forming of a mask layer 202) of a semiconductor device manufacturing method according to a second embodiment of the present invention.

As shown in FIG. 17, first, a mask layer 202 is formed by photoresist, on a silicon substrate 200. The mask layer 202 includes an opening to form a ring-shaped isolation trench.

Figure 18:
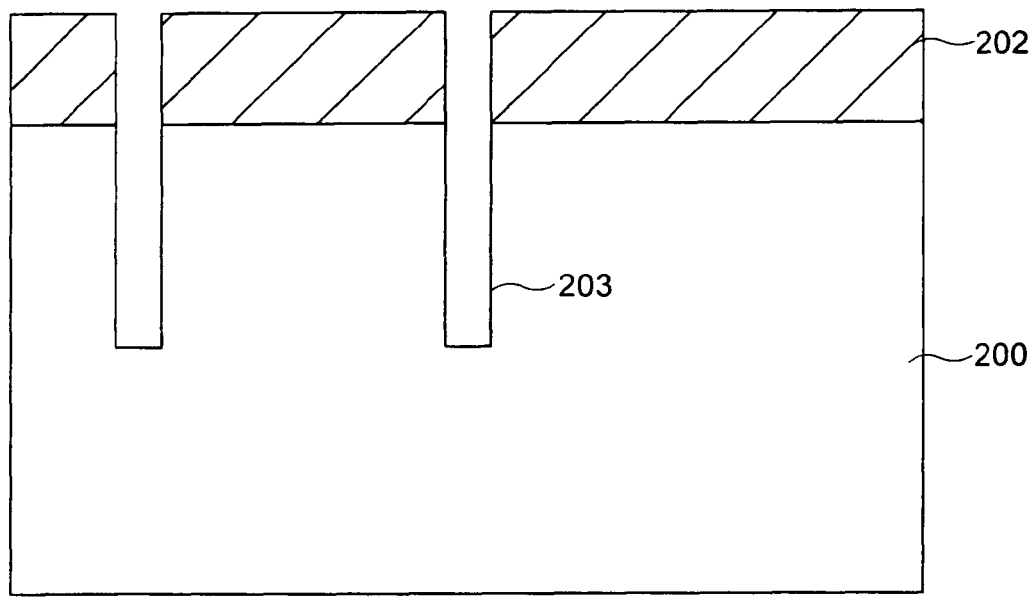
FIG. 18 is a partially cross-sectional view showing one process (forming of a ring-shaped isolation trench 203) of a semiconductor device manufacturing method according to the second embodiment of the present invention.

Next, as shown in FIG. 18, the silicon substrate 200 is etched, using the mask layer 202. As a result, a ring-shaped isolation trench 203 is formed.

Figure 19:
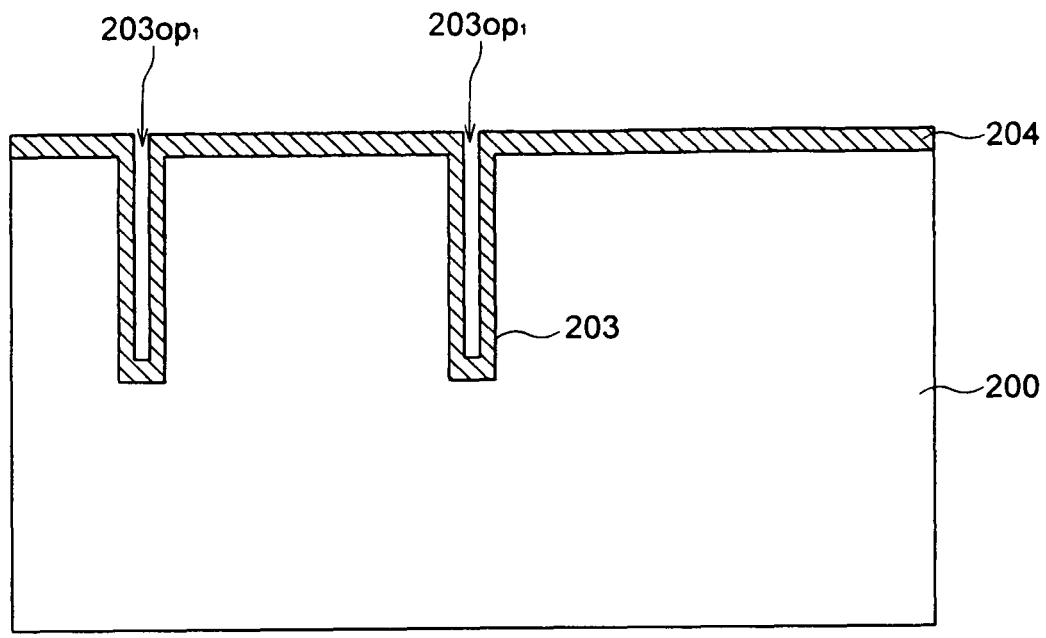
FIG. 19 is a partially cross-sectional view showing one process (forming of a polycrystalline silicon film 204) of a semiconductor device manufacturing method according to the second embodiment of the present invention.

Next, as shown in FIG. 19, a polycrystalline silicon film 204 is formed on the whole surface including the inside of the isolation trench 203, by the CVD method. As a result, the polycrystalline silicon film 204 is formed on the inner surface, an outer surface, and a bottom surface, respectively within the isolation trench 203. Therefore, a gap 203op$_1$ remains within the isolation trench 203.

Figure 20:
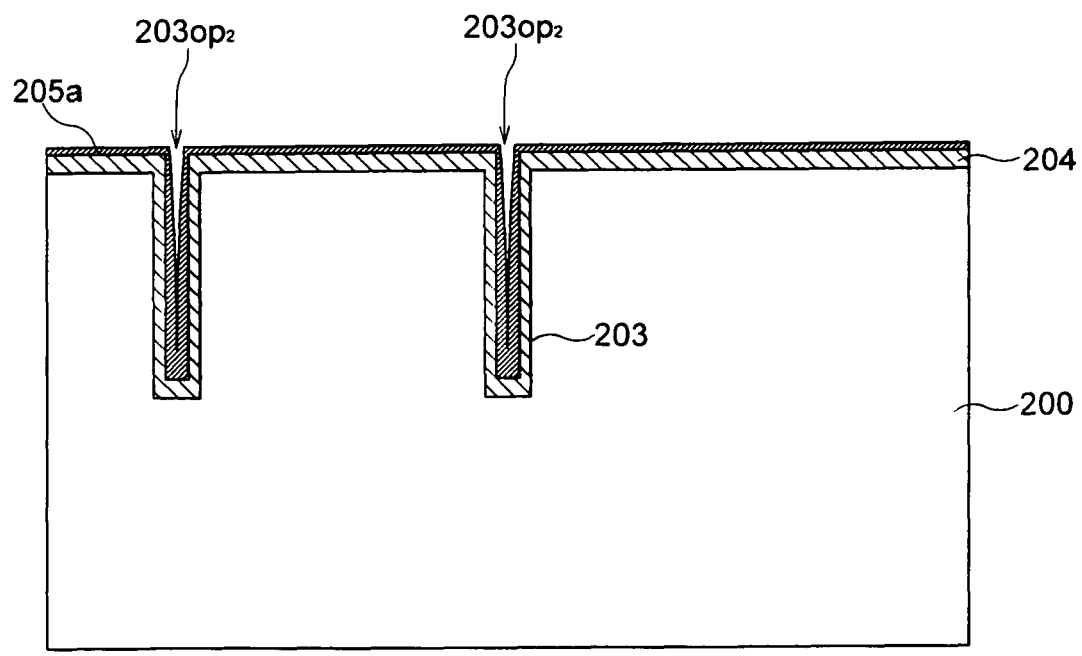
FIG. 20 is a partially cross-sectional view showing one process (forming of a silicon thermal oxide film 205a) of a semiconductor device manufacturing method according to the second embodiment of the present invention.

Next, as shown in FIG. 20, the surface of the polycrystalline silicon film 204 is thermally oxidized. As a result, a silicon thermal oxide film 205a as shown is formed. A gap 203op$_2$ that is not completely filled in by the polycrystalline silicon film 204 and the silicon thermal oxide film 205a remains in the isolation trench 203.

Figure 21:
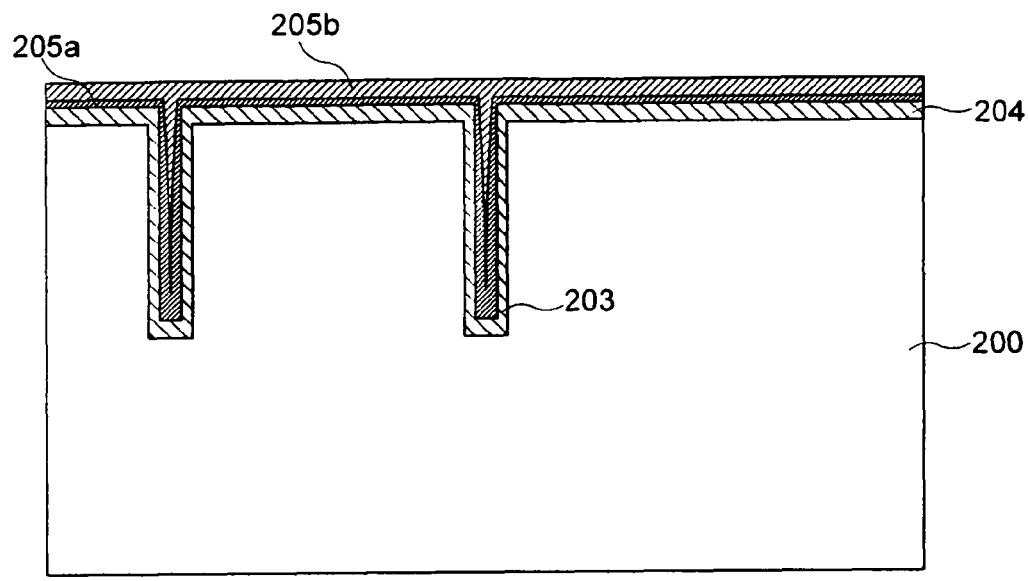
FIG. 21 is a partially cross-sectional view showing one process (forming of a CVD silicon oxide film 205b) of a semiconductor device manufacturing method according to the second embodiment of the present invention.

Next, as shown in FIG. 21, a CVD silicon oxide film 205b is formed on the whole surface to fill in the gap 203op$_2$, by the CVD method. Consequently, a ring-shaped isolation wall 205 including the silicon thermal oxide film 205a and the CVD silicon oxide film 205b is formed within the silicon substrate 200.

Figure 22:
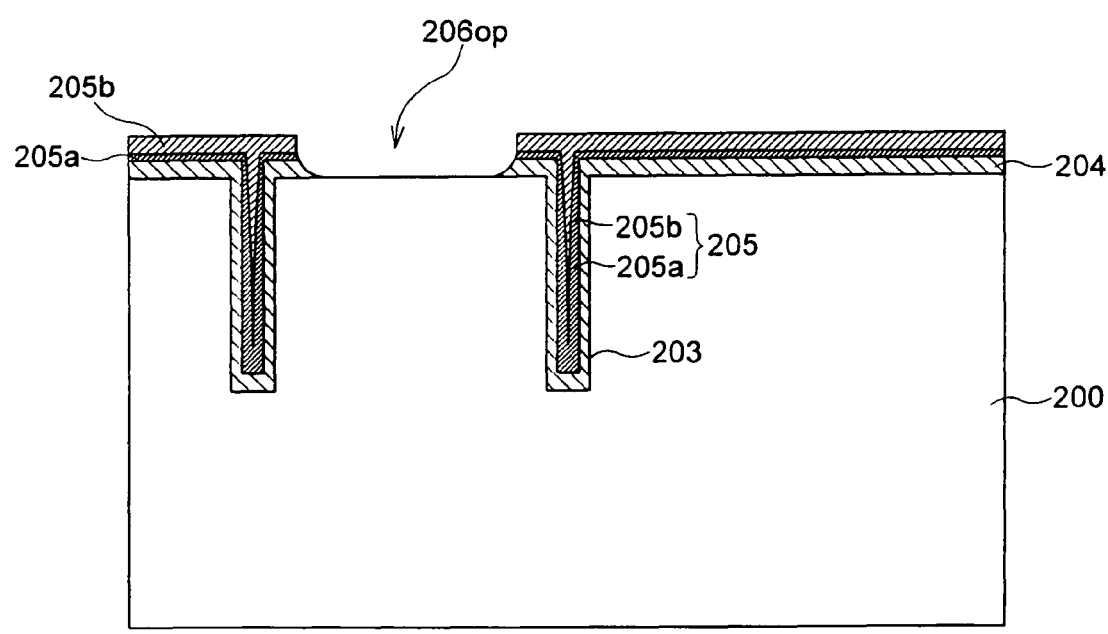
FIG. 22 is a partially cross-sectional view showing one process (forming of an opening 206op) of a semiconductor device manufacturing method according to the second embodiment of the present invention.

Next, as shown in FIG. 22, the CVD silicon oxide film 205b, the silicon thermal oxide film 205a, and the polycrystalline silicon film 204 in the area surrounded by the isolation wall 205 are selectively removed by etching, thereby forming an opening 206op to expose the surface of the silicon substrate 200.

Figure 23:
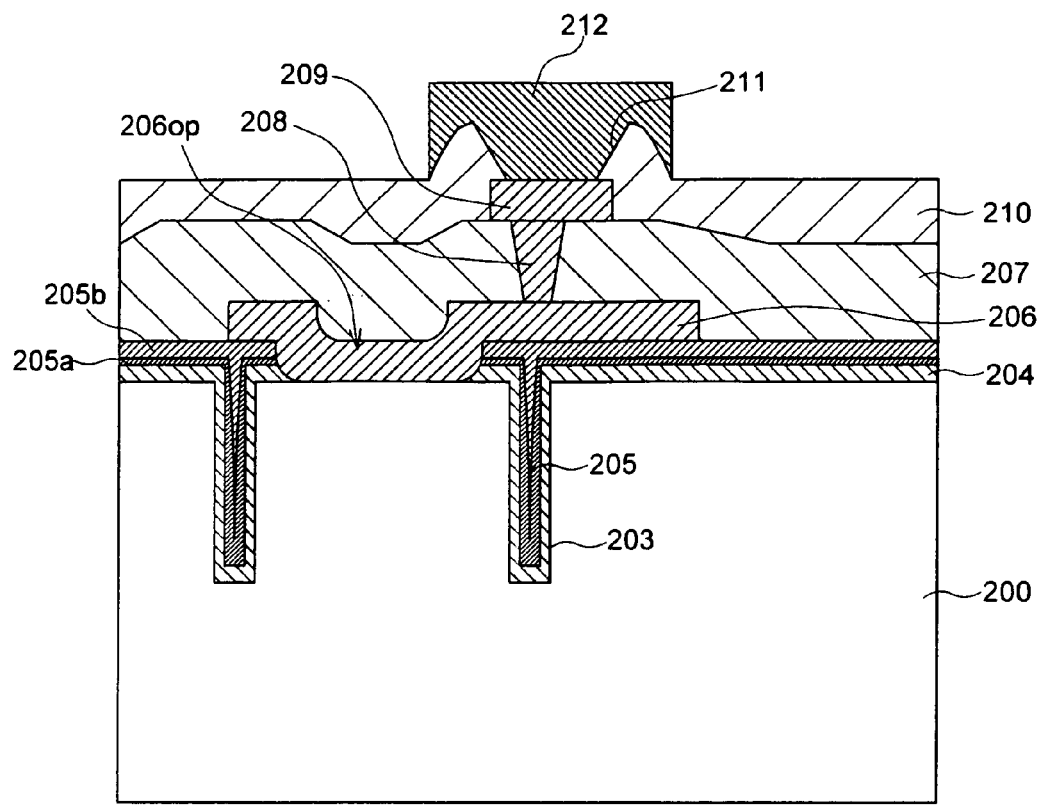
FIG. 23 is a partially cross-sectional view showing one process (forming of a lower-layer wiring 206 to forming of a connection electrode 212) of a semiconductor device manufacturing method according to the second embodiment of the present invention.

Next, as shown in FIG. 23, a conductive film is formed on the whole surface including the opening 206op, and this is patterned in a wiring shape, thereby forming a lower-layer wiring 206 in contact with the surface of the silicon substrate 200 in the area surrounded by the isolation wall 205. The lower-layer wiring 206 becomes in a state of being on the CVD silicon oxide film 205b, except on the opening 206op. Therefore, the silicon thermal oxide film 205a and the CVD silicon oxide film 205b on the silicon substrate 200 function as interlayer insulation films for insulation-isolating the silicon substrate 200 from the lower-layer wiring 206, in the area other than the opening 206op.

After the lower-layer wiring 206 is formed, an interlayer insulation film 207 is formed, and a contact plug 208 connected to the lower-layer wiring 206 is formed. An upper-layer wiring 209 electrically connected to the lower-layer wiring 206 by the contact plug 208 is formed on the contact plug 208. Further, an insulation film 210 that covers the upper-layer wiring 209 is formed, and then an opening 211 that exposes a part of the upper-layer wiring 209 is formed. A connection electrode 212 connected to the upper-layer wiring 209 exposed to the opening 211 is formed.

Thereafter, a process on the rear surface side of the silicon substrate 200 is performed with a same manner as the first embodiment.

Figure 24:
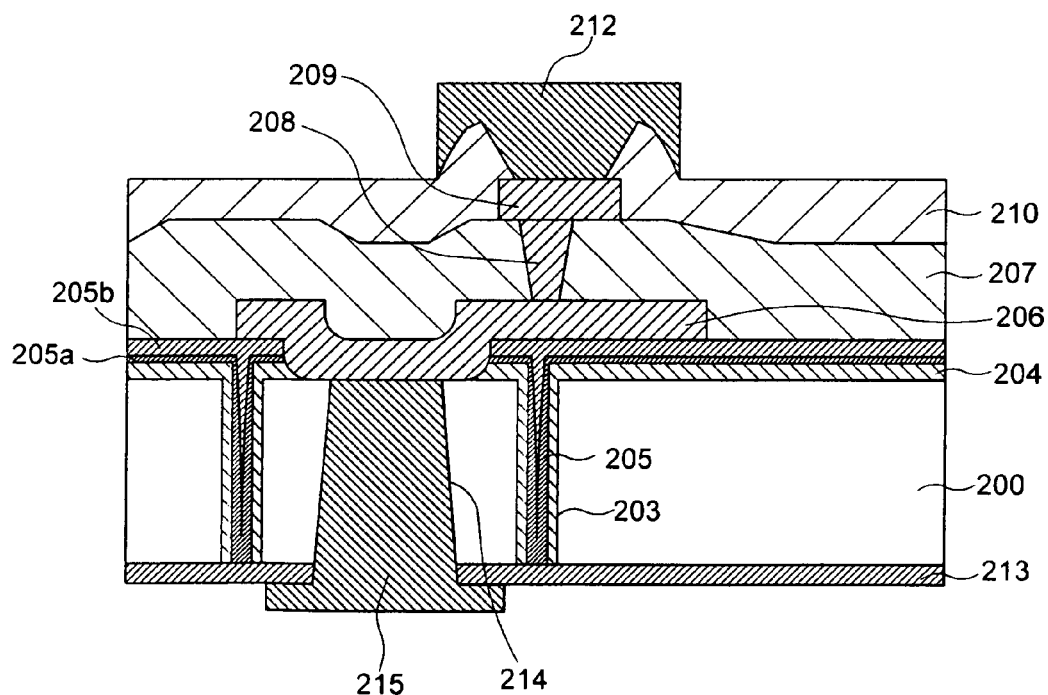
FIG. 24 is a partially cross-sectional view showing one process (grinding of the rear surface of the silicon substrate 200 and forming of a through electrode 215) of a semiconductor device manufacturing method according to the second embodiment of the present invention.
Figure 25A:
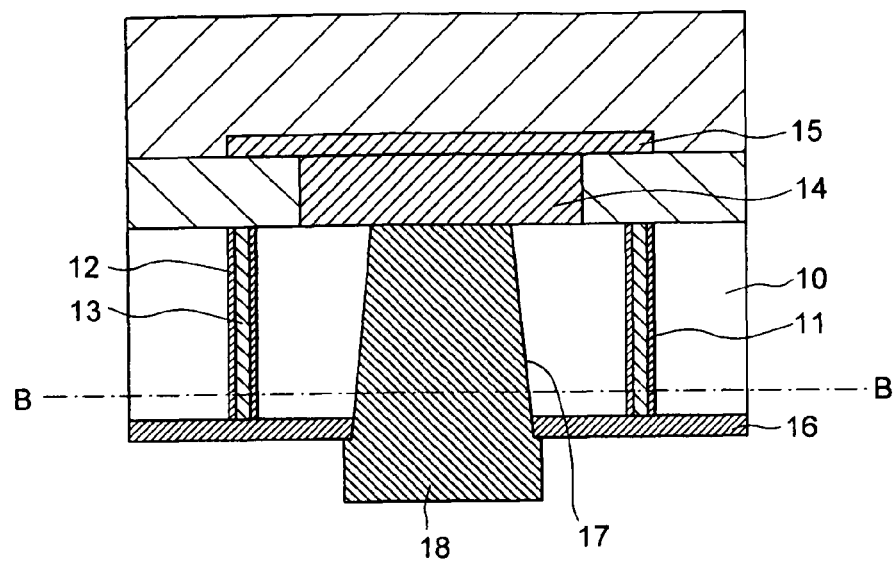
FIG. 25A is a schematic cross-sectional view of one through electrode employed in the conventional chip-stacked semiconductor device.
Figure 25B:
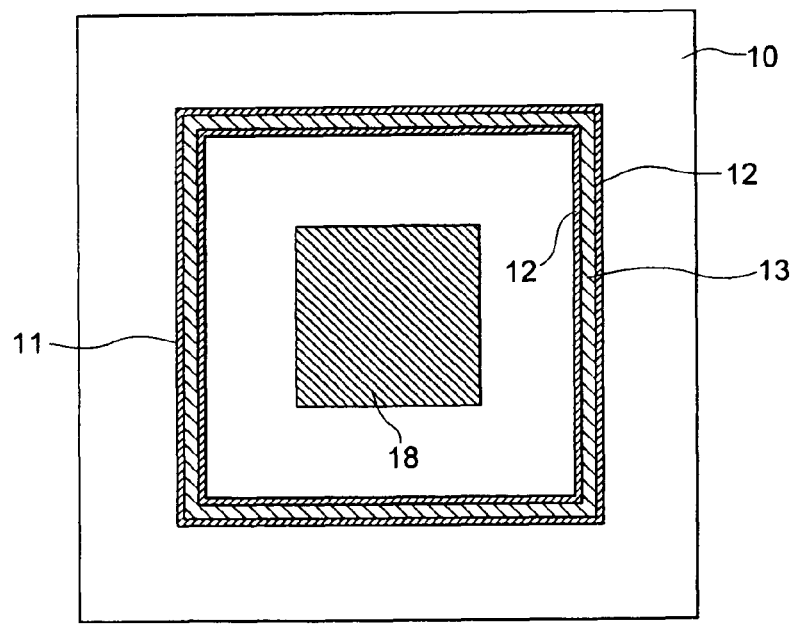
FIG. 25B shows a cross-sectional view along B-B line of FIG. 25A.

First, the rear surface of the silicon substrate 200 is ground, thereby exposing the bottom of the isolation wall 205. As a result, as shown in FIG. 24, the polycrystalline silicon film 204 is divided into an inner surface side and an outer surface side of the isolation trench 203.

Next, a rear-surface insulation film 213 that covers the rear surface of the silicon substrate 200 is formed. In the area surrounded by the isolation wall 205, an opening 214 is formed to penetrate through the rear-surface insulation film 213 and the silicon substrate 200 from the rear surface of the silicon substrate 200, to expose the lower surface of the lower-layer wiring 206.

An electrode film is formed on the whole rear surface to fill in the opening 214, and this electrode film is patterned to form a through electrode 215.

A silicon interposer is completed in this way. The upper connection electrode 212 is formed in the same pitch as that of the through electrode (for example, the through electrode 116 of the first embodiment) of the semiconductor chip mounted on the silicon interposer. The through electrode 215 on the rear surface is formed in the same pitch as that of the electrode of the package substrate, thereby making it possible to convert the electrode pitch.

As described above, also in the second embodiment, only the area of the width of the isolation wall 205, not the width of the isolation trench 203, becomes a dead space like in the first embodiment. As a result, there is an effect that the positioning margin increases at the time of forming the opening 206op to form the through electrode 215 and to form the lower-layer wiring 206.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

In the above embodiments, as an example, a polycrystalline silicon film is used as a film directly formed on the inner surface and the outer surface of the isolation trench. However, a monocrystalline silicon film can be also used in place of the polycrystalline silicon film. The forming of the monocrystalline silicon film takes more time than the forming of the polycrystalline silicon film. However, when the monocrystalline silicon film is used, an active element such as a transistor can be actually formed on this part.

As an insulation film forming the isolation wall, other insulation film than the silicon thermal oxide film or the CVD silicon oxide film achieving the equivalent function can be also used.

The "ring shape" in the above embodiments is not limited to a square shape as shown in FIG. 14, and can be a circular shape as well.

What is claimed is:

1. A semiconductor device comprising:
   a through electrode that penetrates through a substrate;
   an isolation trench provided to penetrate through the substrate to surround an inner portion of the substrate and the through electrode;
   a first silicon film covering an inner surface of the isolation trench;
   a second silicon film covering an outer surface of the isolation trench; and
   an insulation film filled in a gap between the first silicon film and the second silicon film.

2. The semiconductor device as claimed in claim 1, wherein the insulation film includes a silicon thermal oxide film formed by thermally oxidizing a surface of the first and second silicon films.

3. The semiconductor device as claimed in claim 2, wherein the insulation film includes a CVD (Chemical Vapor Deposition) silicon oxide film.

4. The semiconductor device as claimed in claim 1, wherein the insulation film includes a CVD (Chemical Vapor Deposition) silicon oxide film.

5. The semiconductor device as claimed in claim 1, wherein the first and second silicon films comprise polycrystalline silicon films.

6. The semiconductor device as claimed in claim 1, wherein an outer surface of the inner portion of the substrate is defined by the inner surface of the isolation trench.

7. The semiconductor device as claimed in claim 1, wherein an inner surface of the inner portion of the substrate is in contact with the through electrode.

8. The semiconductor device as claimed in claim 1, wherein the isolation trench comprises a ring-shaped isolation trench.

9. The semiconductor device as claimed in claim 1, further comprising:
   a rear-surface insulation film formed on a rear surface of the substrate,
   wherein the first silicon film, the second silicon film, the insulation film and the inner portion of the substrate contact the rear-surface insulation film.

10. The semiconductor device as claimed in claim 9, wherein the first silicon film, the second silicon film, the insulation film extend from the rear-surface insulation film to a main surface of the substrate.

11. The semiconductor device as claimed in claim 7, wherein the through electrode is electrically isolated from an outer portion of the substrate by the insulation film.

12. The semiconductor device as claimed in claim 1, wherein the isolation trench comprises an inner wall and an outer wall which is formed opposite the inner wall, the inner surface of the isolation trench being formed on the inner wall and the outer surface of the isolation trench being formed on the outer wall.

13. A semiconductor device comprising:
    a substrate;
    a trench penetrating the substrate;
    a sidewall film formed in the trench, the sidewall film comprising a first silicon oxide film and a second silicon oxide film laminated in contact with an inner surface of the first silicon oxide film; and
    a rear-surface insulation film formed on a rear surface of the substrate,
    wherein the first silicon oxide film contacts the rear-surface insulation film.

14. The semiconductor device as claimed in claim 13, wherein the first silicon oxide film includes a silicon thermal oxide film.

15. The semiconductor device as claimed in claim 14, wherein the second silicon oxide film includes a CVD (Chemical Vapor Deposition) silicon oxide film.

16. The semiconductor device as claimed in claim 13, wherein the sidewall film comprises a plurality of silicon oxide films including the first silicon oxide film and the second silicon oxide film laminated in contact with the inner surface of the first silicon oxide film, and
    wherein the first silicon oxide film comprises an outermost silicon oxide film of the plurality of silicon oxide films and the first silicon oxide film is separated from a sidewall of the trench.

17. A semiconductor device comprising:
    a substrate;
    a trench penetrating the substrate;
    a sidewall film formed in the trench, the sidewall film comprising:
       a silicon film comprising a polycrystalline silicon film; and
       a silicon oxide film laminated in contact with an inner surface of the silicon film; and
    a film filled in a gap between the silicon oxide film.

18. The semiconductor device as claimed in claim 17, wherein the silicon oxide film includes a silicon thermal oxide film.

19. The semiconductor device as claimed in claim 18, wherein the silicon film comprises a monocrystalline silicon film.

20. The semiconductor device as claimed in claim 17, wherein the film filled in the gap between the silicon oxide film comprises an insulation film.

* * * * *